(12) United States Patent
Kang et al.

(10) Patent No.: US 8,110,499 B2
(45) Date of Patent: Feb. 7, 2012

(54) METHOD OF FORMING A CONTACT STRUCTURE

(75) Inventors: Dae-Hyuk Kang, Gyeonggi-do (KR);
Young-Hoo Kim, Gyeonggi-do (KR);
Chang-Ki Hong, Gyeonggi-do (KR);
Kun-Tack Lee, Gyeonggi-do (KR);
Jae-Dong Lee, Gyeonggi-do (KR);
Dae-Hong Eom, Gyeonggi-do (KR);
Jeong-Nam Han, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 68 days.

(21) Appl. No.: 12/437,390

(22) Filed: May 7, 2009

(65) Prior Publication Data
US 2009/0280641 A1 Nov. 12, 2009

(30) Foreign Application Priority Data
May 7, 2008 (KR) .................. 10-2008-0042251

(51) Int. Cl.
H01L 21/44 (2006.01)
(52) U.S. Cl. ........................................ 438/664
(58) Field of Classification Search .................. 438/653, 438/664
See application file for complete search history.

(56) References Cited

U.S. PATENT DOCUMENTS
2005/0070098 A1 * 3/2005 Bruley et al. ................. 438/655
2005/0282341 A1 * 12/2005 Park et al. .................... 438/283

FOREIGN PATENT DOCUMENTS
JP 05-259113 10/1993
JP 11-238697 8/1999
KR 1020050002995 A 1/2005
* cited by examiner

*Primary Examiner* — Bradley K Smith
(74) *Attorney, Agent, or Firm* — Myers Bigel Sibley & Sajovec, P.A.

(57) ABSTRACT

An insulation layer may be formed on an object having a contact region. The insulation layer may be partially etched to form an opening exposing the contact region. A material layer including silicon and oxygen may be formed on the exposed contact region. A metal layer may be formed on the material layer including silicon and oxygen. The material layer including silicon and oxygen may be reacted with the metal layer to form a metal oxide silicide layer at least on the contact region. A conductive layer may be formed on the metal oxide silicide layer to fill up the opening.

15 Claims, 15 Drawing Sheets

METHOD OF FORMING A CONTACT STRUCTURE

This application claims priority under 35 USC §119 to Korean Patent Application No. 2008-42251, filed on May 7, 2008 in the Korean Intellectual Property Office (KIPO), the contents of which are herein incorporated by reference in their entirety.

BACKGROUND

1. Field

Example embodiments relate to a method of forming a contact structure and a method of manufacturing a semiconductor device having a contact structure. More particularly, example embodiments relate to a method of forming a contact structure including a metal oxide silicide layer and a method of manufacturing a semiconductor device having the contact structure.

2. Description of the Related Art

As for a volatile semiconductor device or a nonvolatile semiconductor device, a metal silicide layer generally is formed between a contact region of a substrate and a contact or a plug in order to reduce the resistance of the contact or the plug. After performing a silicidation process in which silicon included in the contact region of the substrate is reacted with metal included in a metal layer, the metal silicide layer is formed between the contact region and the contact, so that a contact resistance or an interface resistance between the contact and the contact region may be reduced.

To effectively form the metal silicide layer on the contact region, a cleaning process is carried out to remove a native oxide film or other insulating materials from the contact region, and then the metal layer is formed on the cleaned contact region.

FIG. 1 is a cross-sectional view illustrating problems of a conventional process for forming a contact in a semiconductor device.

Referring to FIG. 1, in the conventional process for forming the contact, an insulation layer 3 is partially etched to form a contact hole 5 exposing a contact region of a substrate 1 after forming the insulation layer 3 on the substrate 1 having the contact region (not illustrated).

A native oxide film (not illustrated) generated on the contact region exposed by the contact hole 5 is removed. The native oxide film may be removed from the contact region by a cleaning process using a solution including hydrogen fluoride (HF).

After a metal layer 7 including titanium (Ti) is formed on the contact region, a sidewall of the contact hole 5 and the insulation layer 3, the silicidation process is performed about the substrate 1 having the metal layer 7, to thereby form a metal silicide layer 9 on the contact region. When the metal layer 7 includes titanium, the metal silicide layer 9 includes titanium silicide (TiSix).

As for the conventional process for forming the contact, however, the metal silicide layer 9 may not be uniformly formed on the contact region because the silicidation process is executed after removing the native oxide film from the contact region. That is, the metal silicide layer 9 may be irregularly formed or grains in the metal silicide layer 9 may be agglomerated due to process conditions of the silicidation process such as a process temperature, a process time, etc. Further, the metal silicide layer 9 may not have a desired thickness on the contact region, and also voids may be easily generated between the contact region and the metal silicide layer 9. Particularly, as shown a portion 'I' in FIG. 1, a void may be easily formed between the substrate 1 and the metal silicide layer 9 during the silicidation process because of migrations of metal in the metal layer 7 and silicon in the substrate 1, and also the metal silicide layer 9 may not be properly formed on the contact region with a uniform thickness. Furthermore, an undesired layer 1 having an irregular composition may be easily generated formed on in the metal silicide layer 9. When the contact is formed on the irregular or agglomerated metal silicide layer 9, the interface resistance between the contact region and the contact may not be desirably adjusted to thereby deteriorate electrical characteristics of the semiconductor device having the contact.

Considering the above-mentioned problems, Korean Laid-Open Patent Publication No. 2005-2995 a method of manufacturing a semiconductor device having a double layer structure including a native oxide film and a cobalt silicide layer can be formed between a substrate and a polysilicon plug without removing the native oxide film.

SUMMARY

According to some example embodiments, there is provided a method of forming a contact structure. In some embodiments, a contact structure may be provided on an object having a contact region after an insulation layer is formed on the object having the contact region. The insulation layer is partially etched to form an opening exposing the contact region. A material layer including silicon and oxygen is formed on the exposed contact region. A metal layer is formed on the material layer including silicon and oxygen. The material layer including silicon and oxygen is reacted with the metal layer, so that a metal oxide silicide layer is formed at least on the contact region. A conductive layer is formed on the metal oxide silicide layer to fill the opening.

In example embodiments, the material layer may be formed by a chemical oxidation process, a thermal oxidation process, a chemical vapor deposition (CVD) process, a high density plasma-chemical vapor deposition (HDP-CVD) process, a residue treatment process, or an atomic layer deposition (ALD) process.

In example embodiments, the material layer including silicon and oxygen may be formed using a solution including ozone, a solution including ozone and hydrogen fluoride (HF) and/or a solution including hydrogen peroxide ($H_2O_2$).

In one example embodiment, the material layer including silicon and oxygen may be formed by providing a solution having an ozone concentration of about 10 ppm to about 50 ppm onto the object for about 5 seconds to about 200 seconds.

In another example embodiment, the material layer including silicon and oxygen may be formed by providing an aqueous solution including diluted hydrofluoric acid, wherein a volume ratio of $H_2O$ and HF is about 50:1 to about 1,000:1, and a solution having an ozone concentration of about 10 ppm to about 50 ppm onto the object for about 5 seconds to about 600 seconds.

In still another example embodiment, the material layer including silicon and oxygen may be formed by providing the solution including hydrogen peroxide ($H_2O_2$) onto the object for about 10 seconds to about 600 seconds.

In still another example embodiment, the material layer including silicon and oxygen may be formed by thermally treating the object for about 10 seconds to about 60 seconds under an atmosphere including about 50 to about 90 percent by weight of oxygen.

In still another embodiment, the material layer including silicon and oxygen may be formed by providing a gas including fluorine (F) onto the object under an atmosphere including oxygen ($O_2$).

In example embodiments, the material layer including silicon and oxygen may include silicon oxide, silicon oxynitride or silicon-germanium oxide.

In example embodiments, the metal layer may include titanium (Ti), nickel (Ni), cobalt (Co), platinum (Pt), chrome (Cr), iridium (Ir), tungsten (W), tantalum (Ta), hafnium (Hf), ruthenium (Ru), zirconium (Zr), etc. These may be used alone or in a mixture thereof.

In example embodiments, the metal oxide silicide layer may be additionally formed on a sidewall of the opening.

In example embodiments, the metal oxide silicide layer may have a ternary composition including oxygen, silicon and metal. For example, the metal oxide silicide layer may have a composition represented by the following chemical formula:

$MO_xSi_y$ in which M denotes metal.

In example embodiments, the metal in the metal oxide silicide layer may include titanium (Ti), nickel (Ni), cobalt (Co), platinum (Pt), chrome (Cr), iridium (Ir), tungsten (W), tantalum (Ta), hafnium (Hf), ruthenium (Ru), zirconium (Zr), etc. These may be used alone or in a mixture thereof.

In example embodiments, a diffusion barrier layer may be formed on the metal layer before forming the metal oxide silicide layer.

According to another aspect of example embodiments, there is provided a method of manufacturing a semiconductor device. In the method of manufacturing the semiconductor device, a gate structure is formed on a substrate. The gate structure includes a gate insulation layer and a gate electrode. A contact region is formed at an upper portion of the substrate adjacent to the gate structure. A material layer including silicon and oxygen is formed on the contact region. A metal layer is formed on the material layer and the gate electrode. The material layer and the gate electrode are reacted with the metal layer to form a metal oxide silicide layer on the contact region and a metal silicide layer on the gate electrode, respectively. An insulation layer having an opening is formed on the substrate to cover the gate structure. The opening exposes the metal oxide silicide layer. A conductive layer is formed on the metal oxide silicide layer to fill up the opening.

In example embodiments, the material layer may include silicon oxide, silicon-germanium oxide or silicon oxynitride.

In example embodiments, the metal oxide silicide layer may have a composition of $MO_xSi_y$ and the metal silicide layer may have a composition of $MSi_z$.

According to still another aspect of example embodiments, there is provided a method of manufacturing a semiconductor device. In the method of manufacturing the semiconductor device, gate structures are formed on a substrate. Each of the gate structures includes a gate insulation layer and a gate electrode. A contact region is formed at an upper portion of the substrate adjacent to the gate structures. An insulation layer is formed on the substrate to cover the gate structures. The insulation layer is partially etched to form an opening exposing the contact region. A material layer including silicon and oxygen is formed on the exposed contact region. A metal layer is formed on the material layer, a sidewall of the opening, and the insulation layer. The material layer is reacted with the metal layer to form a metal oxide silicide layer at least on the contact region. A conductive layer is formed on the metal oxide silicide layer to fill up the opening.

In example embodiments, the material layer may be additionally formed on the sidewall of the opening.

In example embodiments, a diffusion barrier layer may be formed on the metal layer before forming the metal oxide silicide layer.

According to example embodiments, the material layer including silicon and oxygen may be formed on the object or the contact region of the substrate. Because a silicidation process may be performed after forming the metal layer on the material layer including silicon and oxygen, the metal oxide silicide layer having the ternary composition containing oxygen, silicon and metal may be uniformly provided.

In some example embodiments, a contact structure may be formed by forming an opening exposing a contact region on a substrate, by forming a material layer including silicon and oxygen on the exposed contact region, by forming a metal layer on the material layer, and by reacting a metal layer on the material layer to form a metal oxide silicide layer directly on the contact region.

In some embodiments, the contact region may be free of a native oxide film when forming the material layer on the contact region.

BRIEF DESCRIPTION OF THE DRAWINGS

Example embodiments will be more clearly understood from the following detailed description taken in conjunction with the accompanying drawings. FIGS. 1 to 12B represent non-limiting, example embodiments as described herein.

FIG. 1 is a cross-sectional view illustrating problems of a conventional process for forming a contact in a semiconductor device.

FIG. 3 is a graph illustrating a composition of a conventional titanium silicide layer formed on a contact region measured using an energy dispersive spectroscopy (EDS).

FIG. 4 is a graph illustrating a composition of a titanium oxide silicide layer in a contact structure in accordance with example embodiments.

FIG. 5 is a graph illustrating contact resistances of contact structures according to Examples and Comparative Examples.

FIG. 6 is a graph illustrating contents of ingredients in contact structures according to Examples and Comparative Examples measured using a secondary ion mass spectrometry (SIMS).

FIG. 7 is a graph illustrating contents of ingredients in contact structures according to Example and Comparative Example.

FIG. 8 is a graph illustrating thicknesses of metal oxide silicide layers in contact structures according to Examples and thicknesses of metal silicide layers in contact structures according to Comparative Examples.

FIG. 12A and FIG. 12B are cross-sectional views illustrating a method of manufacturing a PRAM device including contact structures according to example embodiments.

DESCRIPTION OF EMBODIMENTS

Figure 1:
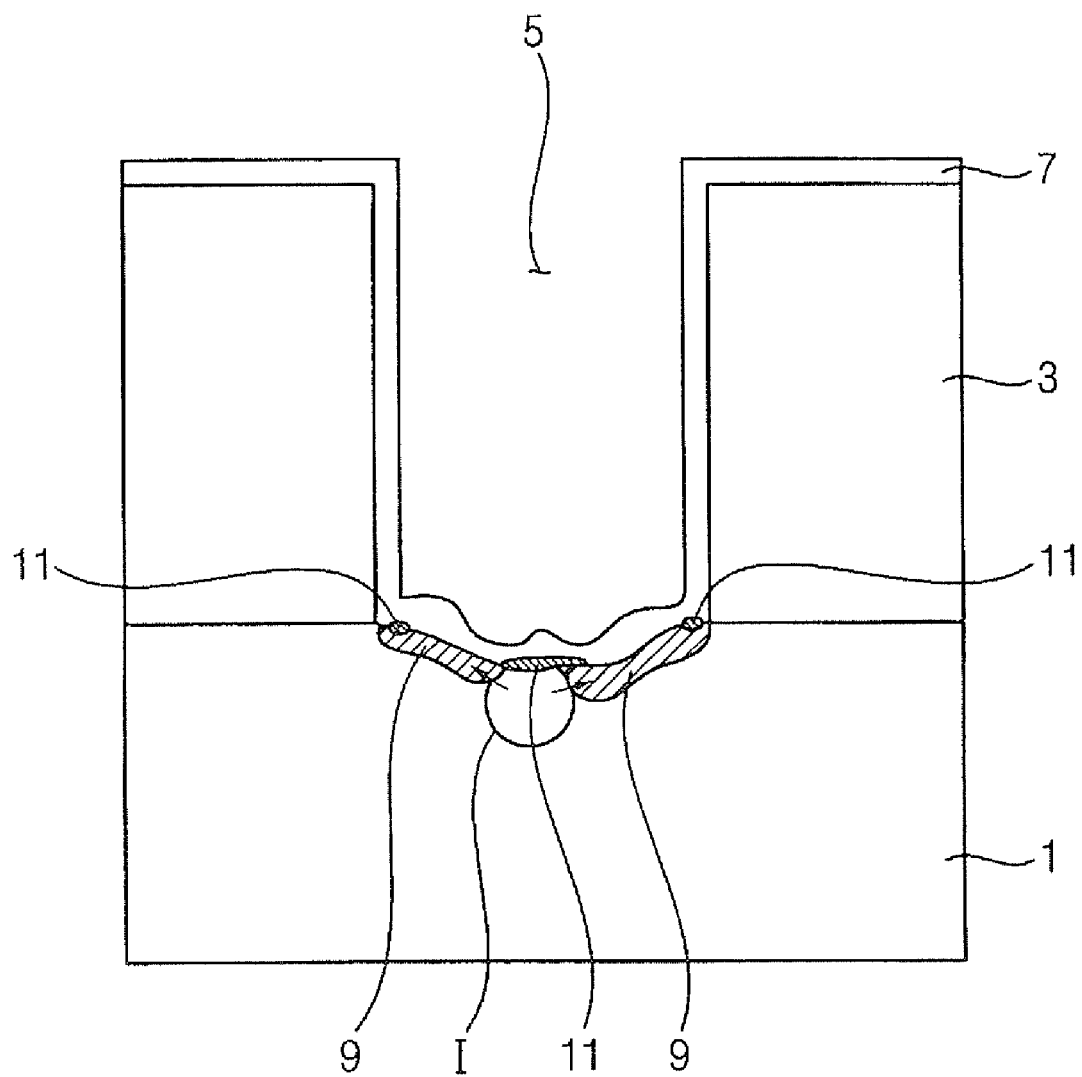

Various example embodiments will be described more fully hereinafter with reference to the accompanying drawings, in which some example embodiments are illustrated. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 2A to 2E are cross-sectional views illustrating a method of forming a contact structure in accordance with example embodiments.

Figure 2A:
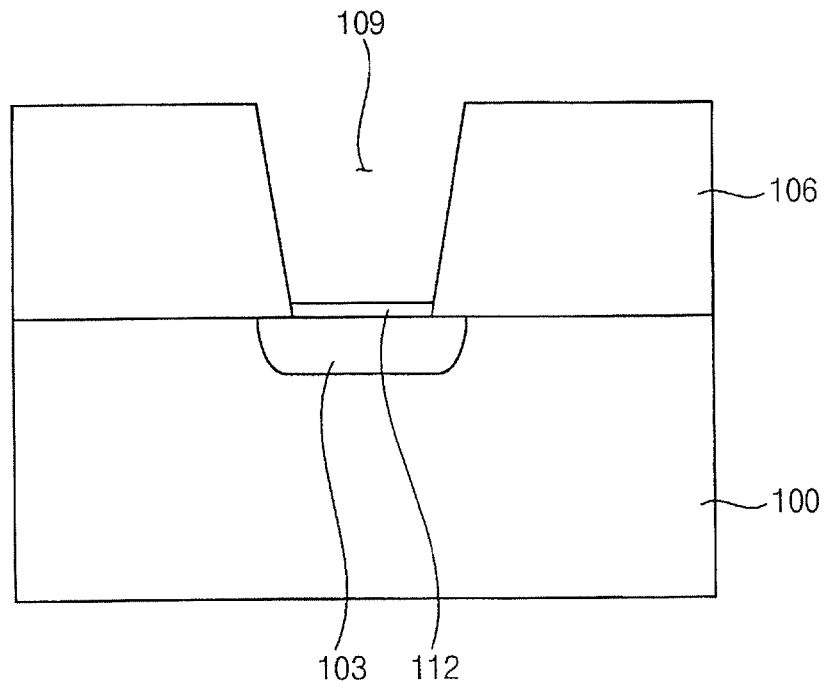
FIGS. 2A to 2E are cross-sectional views illustrating a method of forming a contact structure in accordance with example embodiments.

Referring to FIG. 2A, after a contact region 103 is formed at an upper portion of an object 100, an insulation layer 106 is formed on the object 100. In example embodiments, switching devices (not illustrated) such as transistors may be provided on the object 100.

The object 100 may include a semiconductor substrate, a silicon-on-insulator (SOI) substrate, a germanium-on-insulator (GOI) substrate, a single crystalline metal oxide substrate, etc. Alternatively, the object 100 may include a ceramic substrate or a glass substrate having a semiconductor layer thereon. In example embodiments, the object 100 may include a substrate including silicon such as a silicon substrate, a silicon-germanium substrate, etc.

The contact region 103 may be formed by implanting impurities into the object 100. The contact region 103 may serve as a source/drain region of a transistor. For example, the contact region 103 may be formed by an ion implantation process.

The insulation layer 106 may be formed on the object 100 using oxide, nitride, oxynitride, etc. In example, embodiments, the insulation layer 106 may include silicon oxide, silicon nitride, silicon oxynitride, etc. For example, the insulation layer 106 may be formed using undoped silicate glass (USG), spin on glass (SOG), phosphor silicate glass (PSG), boron silicate glass (BSG), boro-phosphor silicate glass (BPSG), flowable oxide (FOX), tetraethylorthosilicate (TEOS), plasma enhanced-TEOS (PE-TEOS), Tonen silazane (TOSZ), high-density plasma-chemical vapor deposition (HDP-CVD) oxide, etc. These may be used alone or in combination thereof. Further, the insulation layer 106 may be formed by a spin coating process, a chemical vapor deposition (CVD) process, a plasma enhanced chemical vapor deposition (PECVD) process, a high density plasma-chemical vapor deposition (HDP-CVD) process, etc.

In some example embodiments, the insulation layer 106 may have a multi layer structure that may include an oxide film, a nitride film and/or an oxynitride film sequentially formed on the object 100.

Referring now to FIG. 2A, the insulation layer 106 is partially etched to form an opening 109 through the insulation layer 106. The opening 109 may expose the contact region 103 of the object 100. The opening 109 may be formed by a dry etching process using a photoresist pattern (not illustrated) or a hard mask pattern (not illustrated) as an etching mask. Alternatively, the opening 109 may be formed by a wet etching process. In example embodiments, the opening 109 may have an upper portion substantially wider than a lower portion thereof. Namely, the opening 109 may have a sidewall inclined with respect to the object 100.

A material layer 112 is formed on the contact region 103 exposed by the opening 109. The material layer 112 may include silicon and oxygen. The material layer 112 may be formed by a chemical oxidation process, a thermal oxidation process, a CVD process, a PECVD process, a HDP-CVD process, an atomic layer deposition (ALD) process, etc. For example, the material layer 112 may be formed using silicon oxide, silicon-germanium oxide, silicon oxynitride, etc.

The material layer 112 may have a thickness varied according to a thickness of a metal layer 115 (see FIG. 2B) successively formed and process conditions of a silicidation process such as a process temperature, a process time, etc. For example, the material layer 112 may have a thickness of about 1.0 Å to about 100 Å based on an upper face of the contact region 103. In example embodiments, the material layer 112 may be a maximum thickness ensuring a metal oxide silicide layer 121 having a ternary composition of metal-oxygen-silicon obtained by completely reacting the material layer 112 with the metal layer 115. That is, the material layer 112 including silicon and oxygen may have a variable thickness in which silicon atoms and oxygen atoms in the material layer 112 and metal atoms in the metal layer 115 may form a ternary composition of metal, oxygen and silicon.

In example embodiments, the material layer 112 having a desired thickness may be uniformly formed on the contact region 103 by a chemical oxidation process using a solution including ozone, a solution including ozone and hydrogen fluoride (HF), a solution including hydrogen peroxide ($H_2O_2$), etc. These may be used alone or in a combination thereof.

In some example embodiments, the material later 112 may be formed on the contact region 103 by a residue treatment process performed after forming a gate electrode of the transistor. For example, the material layer 112 may be formed while the residue treatment process is executed about the object 100 using a gas including fluorine (F) under an atmosphere including oxygen ($O_2$), or by providing a standard cleaning 1 (SC1) solution. Here, the material layer 112 may have a thickness below about 20 Å measured from the upper face of the contact region 103.

When the material layer 112 is formed using the solution including ozone, the material layer 112 may be formed by providing a solution having an ozone concentration of about 10 ppm to about 50 ppm for about 5 seconds to about 200 seconds onto the object 100.

When the material layer 112 is formed using the solution including ozone and hydrogen fluoride, the material layer 112 may be formed by providing an aqueous solution including diluted hydrofluoric acid wherein a volume ratio between $H_2O$ and HF is about 50:1 to about 1,000:1, and an aqueous solution having an ozone concentration of about 10 ppm to about 50 ppm for about 5 seconds to about 600 seconds onto the object 100. Alternatively, the material layer 112 may be formed by providing an aqueous solution including hydrogen peroxide for about 10 seconds to about 600 seconds onto the object 100.

In other example embodiments, the material layer 112 may be formed by performing a thermal oxidation process about the object having the contact region 103 for about 10 seconds to about 60 seconds under an atmosphere including oxygen ($O_2$). When the material layer 112 has an oxygen content of about 50 percent by weight to about 90 percent by weight, the material layer 112 may have desired characteristics. Alternatively, the material layer 112 may be formed on the contact region 103 by an ashing process using oxygen plasma.

Figure 2B:
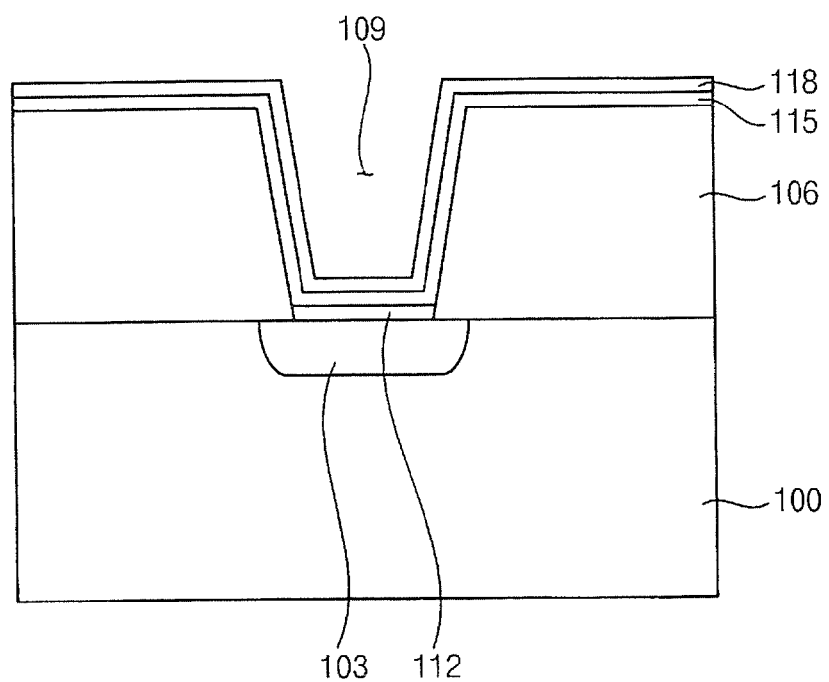

Referring to FIG. 2B, the metal layer 115 is formed on the material layer 112, a side wall of the opening 109 and an insulation layer 106. The metal layer 115 may be conformally formed along profiles of the material layer 112, the opening 109 and the insulation layer 106. The metal layer 115 may be formed using titanium (Ti), nickel (Ni), cobalt (Co), platinum (Pt), chrome (Cr), iridium (Ir), tungsten (W), tantalum (Ta), hafnium (Hf), ruthenium (Ru), zirconium (Zr), etc. These may be used alone or in a mixture thereof. The metal layer 115 may be formed on the material layer 112 by an ALD process, a sputtering process, a CVD process, a pulsed laser deposition (PLD) process, an evaporation process, a plating process, etc.

A diffusion barrier layer 118 is formed on the metal layer 115. The diffusion barrier layer 118 may prevent the diffusion of metal from a metal oxide silicide layer 121 (see FIG. 2C) in successive processes. The diffusion barrier layer 118 may be formed by an ALD process, a sputtering process, a CVD process, a PLD process, an evaporation process, a plating process, etc. For example, the diffusion barrier layer 118 may be formed using titanium nitride (TiNx), tungsten nitride (WNx), nickel nitride (NiNx), tantalum nitride (TaNx), hafnium nitride (HfNx), etc. These may be used alone or in a mixture thereof.

In some example embodiments, the diffusion barrier layer 118 may be omitted according to the composition of metal layer 115 and process conditions of the silicidation process.

Figure 2C:
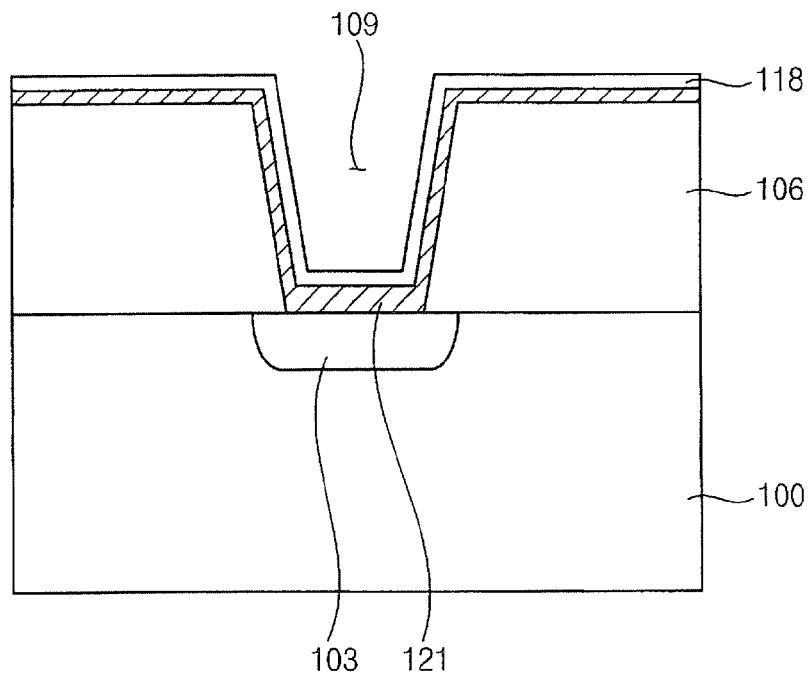

Referring to FIG. 2C, the silicidation process is performed about the material layer 112 and the metal layer 115, so that the material layer 112 and the metal layer 115 are converted into the metal oxide silicide layer 121. That is, a heat treatment process may be executed on the object 100 having the material layer 112 and the metal layer 115 to form the metal oxide silicide layer 121 between the contact region 103 and the diffusion barrier layer 118. The metal oxide silicide layer 121 may have the ternary composition of metal, oxygen and silicon represented a chemical formula of MOxSiy wherein M indicates metal such as titanium, nickel, cobalt, platinum, chrome, iridium, tantalum, hafnium, ruthenium, zirconium, etc.

In example embodiments, the metal oxide silicide layer 121 may be formed by a rapid thermal process (RTP). For example, the RTP may be carried out at a temperature of about 400° C. to about 600° C. for about 10 seconds to about 60 seconds.

In some example embodiments, when the insulation layer 106 includes silicon oxide, the metal layer 115 may be reacted with both of the insulation layer 106 and the material layer 112 in the silicidation process. Accordingly, the metal oxide silicide layer 121 may be formed between the insulation layer 106 and the diffusion barrier layer 118. Namely, the material layer 112 and the metal layer 115 may be entirely changed into the metal oxide silicide layer 121.

When the insulation layer 106 does not include silicon and oxygen, the metal oxide silicide layer 121 may be formed only on the contact region 103. Specifically, when the metal layer 115 is reacted with the material layer 112, only a portion of the metal layer 115 over the contact region 103 may be reacted with the material layer 112 to form the metal oxide silicide layer 121.

Figure 2D:
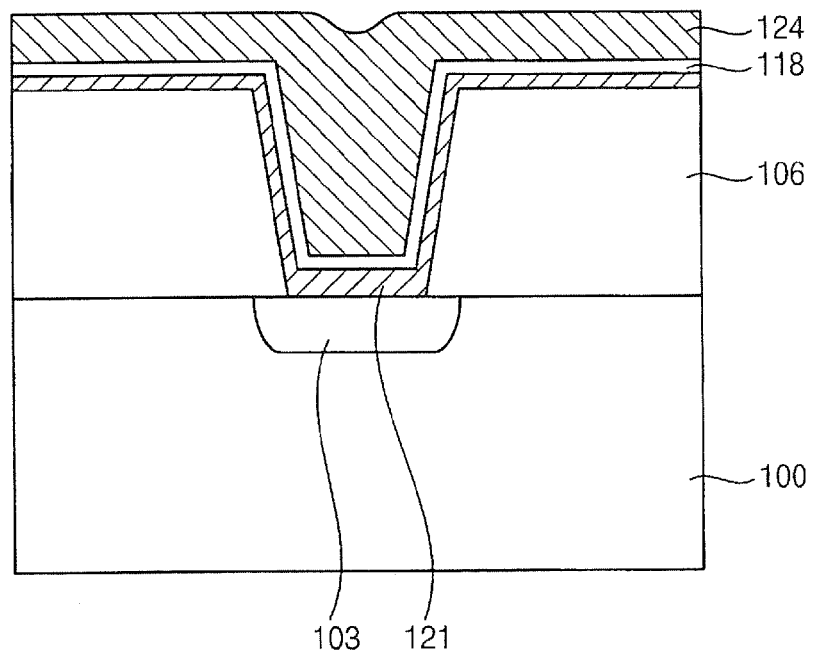

Referring to FIG. 2D, a conductive layer 124 is formed on the diffusion barrier layer 118 to fill up the opening 109. The conductive layer 124 may be formed using polysilicon, metal and/or metal compound. For example, the conductive layer 124 may be formed using polysilicon doped with impurities, tungsten (W), titanium (Ti), tantalum (Ta), aluminum (Al), copper (Cu), tungsten nitride, titanium nitride, aluminum nitride, titanium aluminum nitride, etc. These may be used alone or in a mixture thereof. Further, the conductive layer 124 may be formed on the diffusion barrier layer 118 by an ALD process, a sputtering process, a CVD process, a PLD process, an evaporation process, a plating process, etc.

When the diffusion barrier layer 118 is provided on the metal oxide silicide layer 121, diffusion of metal atoms from the metal oxide silicide layer 121 may be effectively prevented in the process for forming the conductive layer 124 or other successive processes for forming the transistor.

Figure 2E:
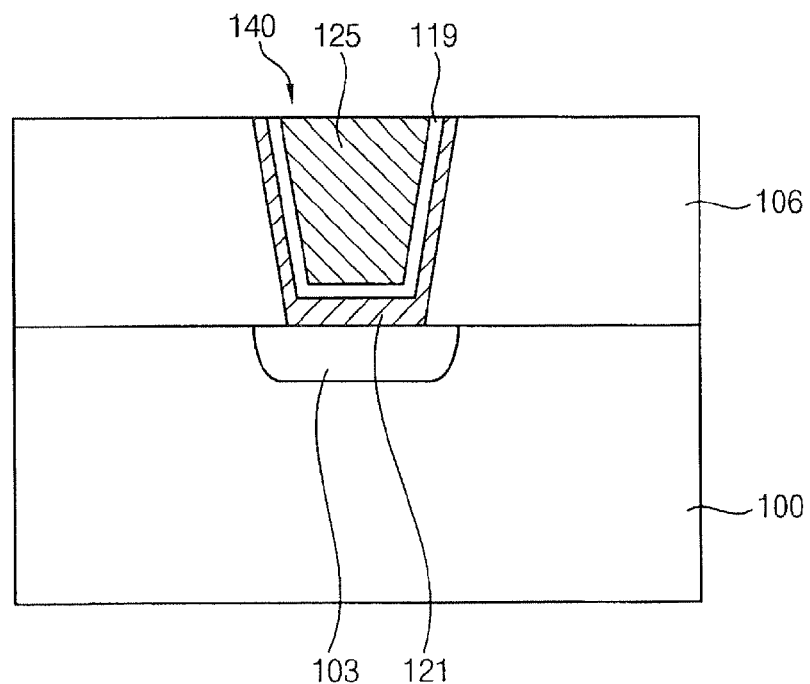

Referring to FIG. 2E, the conductive layer 124, the diffusion barrier layer 118 and the metal oxide silicide layer 121 are partially etched until the insulation layer is exposed. Thus, a contact structure 140 filling up the opening 109 is formed on the contact region 103. The contact structure 140 includes a metal oxide silicide layer pattern 122, a diffusion barrier layer pattern 119 and a conductive layer pattern 125 sequentially formed on the contact region 103. For example, the contact structure 140 may be formed by a chemical mechanical polishing (CMP) process and/or an etch-back process.

As appreciated by the present inventors, in the method of the Korean Laid-Open Patent Publication No. 2005-2995, the cobalt silicide layer is formed by reacting a cobalt layer with an irregular native oxide film having a very thin thickness, so that the cobalt silicide layer may not have a uniform thickness and may have an irregular composition. Therefore, an interface resistance between a contact region and a contact may not be properly controlled to also thereby deteriorate electrical characteristics of the semiconductor device having the cobalt silicide layer which may not ensure desired density and electrical characteristics. Accordingly, in example embodiments, the material layer 112 may be formed to include silicon and oxygen (as described herein) to promote the formation of a more uniform material layer 112 so that when the silicidation of the material layer 112 occurs, the metal oxide silicide layer 121 may have improved density and electrical characteristics.

Figure 3:
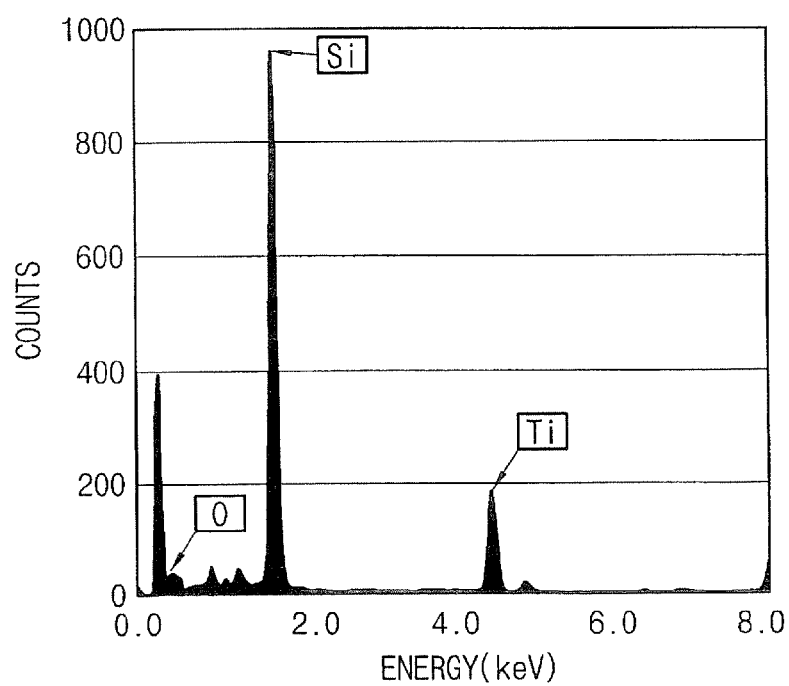
Figure 4:
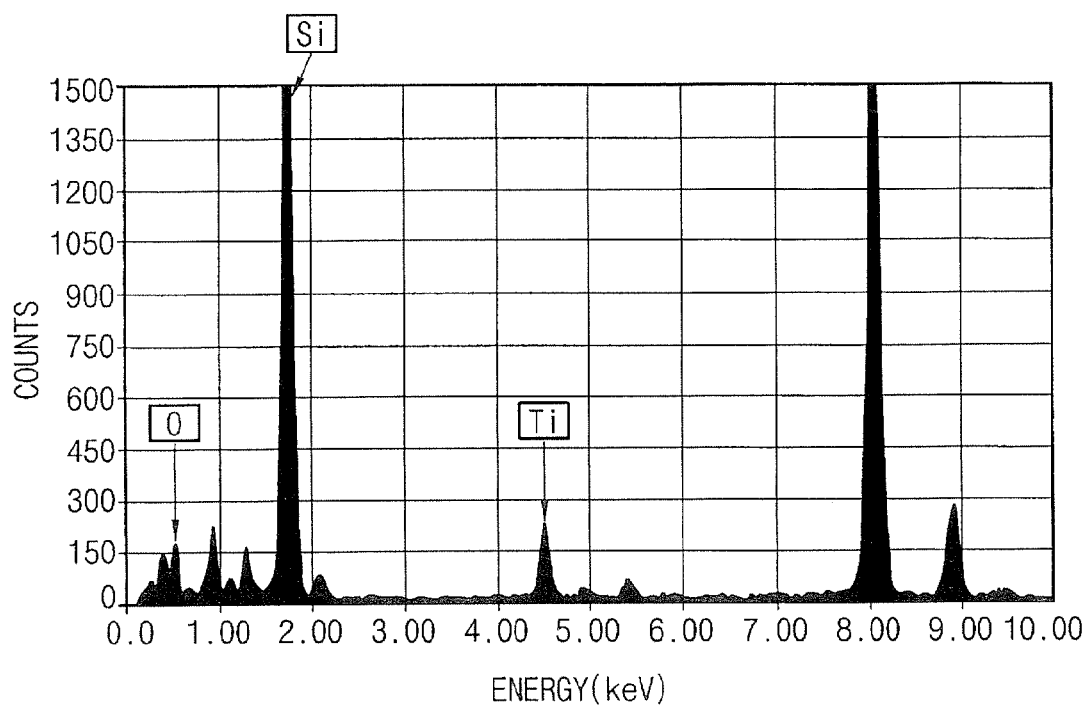

FIG. 3 is a graph illustrating a composition of a conventional titanium silicide layer formed on a contact region measure using an energy dispersive spectroscopy (EDS). FIG. 4 is a graph illustrating a composition of a titanium oxide silicide layer in a contact structure in accordance with example embodiments.

Referring to FIG. 3 the conventional titanium silicide layer substantially may not include oxygen, and thus the conventional titanium silicide layer may not have a ternary composition of oxygen-silicon-titanium. However, as illustrated in FIG. 4, oxygen and titanium exist have substantially similar amounts in the titanium oxide silicide layer according to example embodiments, so that the titanium oxide silicide layer has a ternary composition of oxygen-silicon-titanium represented by a chemical formula of $TiO_xSi_y$. Therefore, the metal oxide silicide layer according to example embodiments may have improved density and thermal stability, and may provide enhanced electrical characteristics in comparison with the conventional metal silicide layer.

When a silicidation process is carried out after removing a native oxide film existing on a silicide layer in the conventional process, grains of a metal silicide layer may be agglomerated on a substrate. However, when a silicidation process is carried out after forming a material layer including silicon and oxygen on a substrate, a metal oxide silicide layer may not be agglomerated on the substrate.

Meanwhile, when the silicidation process is performed after removing a native oxide film existing on a silicide-germanium layer in the conventional process, grains of a metal silicide layer may be comparatively agglomerated on a substrate. However, agglomerations of grains in a metal oxide silicide layer may be remarkably reduced on a silicon-germanium substrate when a silicidation process is executed after forming a material layer including silicon and oxygen on the substrate.

According to example embodiments, a material layer including silicon and oxygen is formed on a contact region of an object, and then a silicidation process is carried out. Hence, a metal oxide silicide layer having a ternary composition of oxygen-silicon-metal may be uniformly formed with a desired thickness between the contact region and a contact or a plug. Here, oxygen may uniformly exist in the metal oxide silicide layer, so that agglomerations of the metal oxide silicide layer may be effectively prevented. When a contact structure includes the metal oxide silicide layer, an interface resistance between the contact structure and the contact or the plug may be properly controlled.

Hereinafter, characteristics of contact structures according to various Examples and Comparative Examples will be described.

Example 1

After forming a contact region on a substrate, an insulation layer was formed on the substrate. An opening exposing the contact region was formed through the insulation layer, and then a silicon oxide layer was formed on the contact region by providing an aqueous solution including diluted hydrofluoric acid, wherein a volume ratio of $H_2O$ and HF was about 1,000:1, and an aqueous solution having an ozone concentration of about 15 ppm for about 90 seconds onto the contact region of the substrate.

After a titanium layer was formed on the silicon oxide layer, a titanium oxide silicide layer was formed on the substrate by performing a silicidation process in which the silicon oxide layer was reacted with the titanium layer.

Example 2

After forming a contact region on a substrate, an insulation layer was formed on the substrate. After forming an opening exposing the contact region through the insulation layer, a silicon oxide layer was formed on the contact region by providing an aqueous solution having an ozone concentration of about 25 ppm for about 150 seconds onto the contact region.

A titanium layer was formed on the silicon oxide layer, and then a titanium oxide silicide layer was formed on the contact region by performing a silicidation process in which the silicon oxide layer was reacted with the titanium layer.

Example 3

A titanium oxide silicide layer was formed on a substrate through a process substantially the same as or substantially similar to that of Example 1, except that a silicon oxide layer was formed on a contact region of the substrate by providing an aqueous solution having an ozone concentration of about 35 ppm for about 80 seconds onto the contact region of the substrate.

Example 4

A titanium oxide silicide oxide layer was formed on a substrate through a process substantially the same as or substantially similar to that of Example 1, except that a silicon oxide layer was formed on a contact region by providing an aqueous solution including diluted hydrofluoric acid, wherein a volume ratio of $H_2O$ and HF was about 200:1, and an aqueous solution having an ozone concentration of about 30 ppm for about 120 seconds onto the contact region of the substrate.

Example 5

A titanium oxide silicide layer was formed on a substrate having a contact region through a process substantially the same as or substantially similar to that of Example 1, except that a silicon oxide layer was formed on the contact region by providing an aqueous solution having an ozone concentration of about 45 ppm for about 150 seconds onto the contact region of the substrate.

Example 6

A titanium oxide silicide layer was formed on a substrate having a contact region by a process substantially the same as or substantially similar to that of Example 1 except that a silicon oxide layer was formed on the contact region by providing an aqueous solution including diluted hydrofluoric acid, wherein a volume ratio of $H_2O$ and HF was about 500:1, and an aqueous solution having an ozone concentration of about 10 ppm for about 300 seconds onto the contact region.

Comparative Example 1

After forming an insulation layer on a substrate having a contact region, an opening exposing the contact region was formed through the insulation layer. A native oxide film exposed by the opening was removed using an aqueous solution including diluted hydrofluoric acid, wherein a volume ratio of $H_2O$ and HF was about 200:1, for about 40 seconds. Then, a titanium silicide layer was formed on the contact region of the substrate through a process substantially the same as or substantially similar to that of Example 1.

Comparative Example 2

A titanium silicide layer was formed on a contact region of a substrate through a process substantially the same as or substantially similar to that of Example 1, except that a native oxide film on the contact region was removed using an aqueous solution including diluted hydrofluoric acid, wherein a volume ratio of $H_2O$ and HF was about 300:1, for about 60 seconds.

Comparative Example 3

A titanium silicide layer was formed on a contact region of a substrate through a process substantially the same as or substantially similar to that of Example 1 except that a native oxide film on the contact region was removed using an aqueous solution including diluted hydrofluoric acid, wherein a volume ratio of $H_2O$ and HF was about 1,000:1, for about 120 seconds.

Comparative Example 4

A titanium silicide layer was formed on a contact region of a substrate by a process substantially the same as or substantially similar to that of Example 1, except that a native oxide film on the contact region was removed by proving an aqueous solution including diluted hydrofluoric acid, wherein a volume ratio of $H_2O$ and HF was about 800:1, for about 120 seconds.

Comparative Example 5

A titanium silicide layer was formed on a contact region of a substrate through a process substantially the same as or substantially similar to that of Example 1, except that a native oxide film on the contact region was removed by proving an aqueous solution including hydrofluoric acid, wherein a volume ratio of $H_2O$ and HF was about 500:1, for about 60 seconds.

Comparative Example 6

A titanium silicide layer was formed on a contact region of a substrate through a process substantially the same as or substantially similar to that of Example 1, except that a native oxide film on the contact region was removed by proving an aqueous solution including diluted hydrofluoric acid, wherein a volume ration of $H_2O$ and HF was about 600:1, for about 80 seconds.

As for Example 1 to Example 6, the silicon oxide layers were formed on the contact regions through various processes. When the silicidation processes were performed after forming the silicon oxide layers, the titanium oxide silicide layer were formed uniformly on the contact regions. However, when the silicon oxide layers were formed using the aqueous solutions including diluted hydrofluoric acid and the aqueous solutions including ozone, some of the titanium oxide silicide layers were formed with relatively thin thicknesses. In Comparative Example 1 to Comparative Example 6, when the silicidation processes were carried out after removing the native oxide films on the contact regions using the aqueous solutions including diluted hydrofluoric acid, the titanium silicide layers were not uniformly formed on the contact regions and grains in the titanium silicide layers may be agglomerated on the contact regions.

Figure 5:
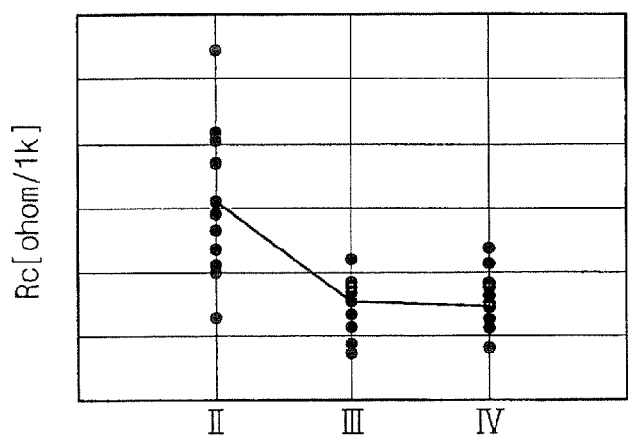

FIG. 5 is a graph illustrating contact resistances of contact structures according to Examples and Comparative Examples. In the FIG. 5, "II" represents the titanium silicide layers formed after removing the native oxide films according to Comparative Examples 1 to 6, and "III" indicates the titanium oxide silicide layers formed after forming the silicon oxide layers using the aqueous solutions including diluted hydrofluoric acid and the aqueous solutions including ozone according to Examples 1, 4 and 6. Additionally, "IV" denotes the titanium oxide silicide layers formed after forming the silicon oxide layers using the aqueous solutions including ozone according to Examples 2, 3 and 5.

As illustrated in FIG. 5, the contact resistances of the contact structures including the titanium oxide silicide layers, which were formed by the silicidation processes after forming the silicon oxide layers on the contact regions using the aqueous solutions including hydrofluoric acid and ozone or the aqueous solutions including ozone, are greatly reduced to less than or substantially equal to about 70% of initial resistances thereof in comparison with the contact resistances of the contact structures including the titanium silicide layers formed after removing the native oxide films.

Figure 6:
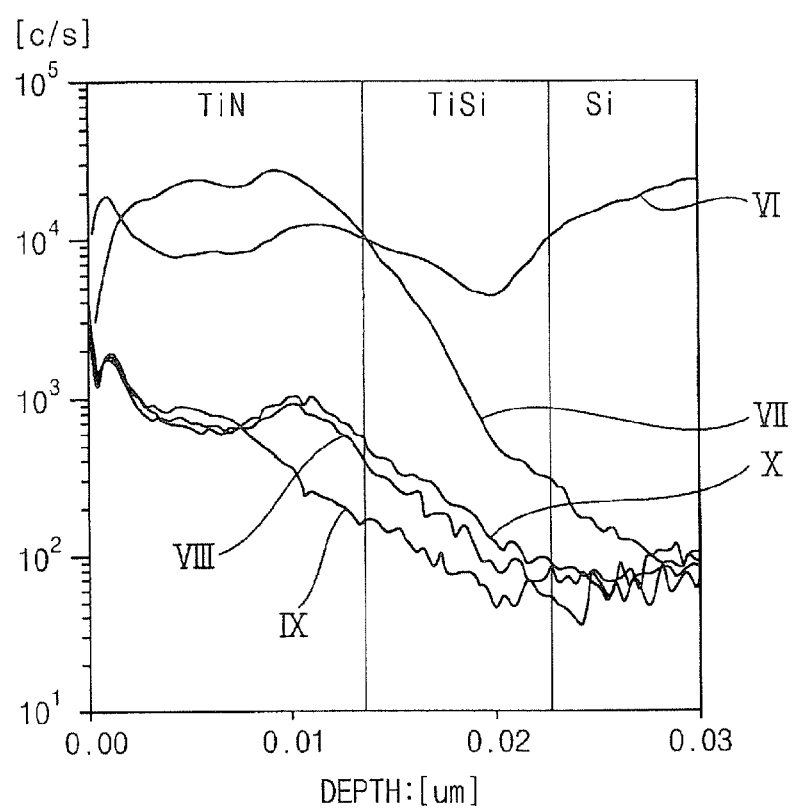

FIG. 6 is a graph illustrating contents of ingredients in contact structures according to Examples and Comparative Examples measured using a secondary ion mass spectrometry (SIMS). In FIG. 22, "VI" represents a silicon content in a first contact structure including the titanium oxide silicide layer formed by the silicidation process after forming the silicon oxide layer on the contact region using the aqueous solution including diluted hydrofluoric acid and the aqueous solution including ozone according to Example 1. Additionally, "VII" denotes a titanium nitride content in the first contact structure, and "VIII" indicates an oxygen content in the first contact structure. Further, "IX" means an oxygen content in a second contact structure including the titanium silicide formed by the silicidation process after removing the native oxide film using the aqueous solution including diluted hydrofluoric acid according to Comparative Example 1. Furthermore, "X" means a silicon content in a third contact structure including the titanium oxide silicide layer formed by the silicidation process after forming the silicon oxide layer on the contact region using the aqueous solution including ozone according to Example 5.

Referring to FIG. 6, in the first to the third contact structures, the contents of oxygen are substantially similar between the titanium oxide silicide layers and interfaces of the silicon substrates. However, when the titanium oxide silicide layer is formed using the aqueous solution including ozone, the oxygen content is sufficient so that the titanium oxide silicide layer may a relatively thick thickness. When the aqueous solution including ozone is employed, the oxygen content increases from the titanium oxide silicide layer toward the titanium nitride layer. Thus, oxygen may be diffused and disappeared at an interface between the titanium nitride layer and the titanium oxide silicide layer. Further, the silicon content increases from the titanium oxide silicide layer toward the substrate or the titanium nitride layer.

Figure 7:
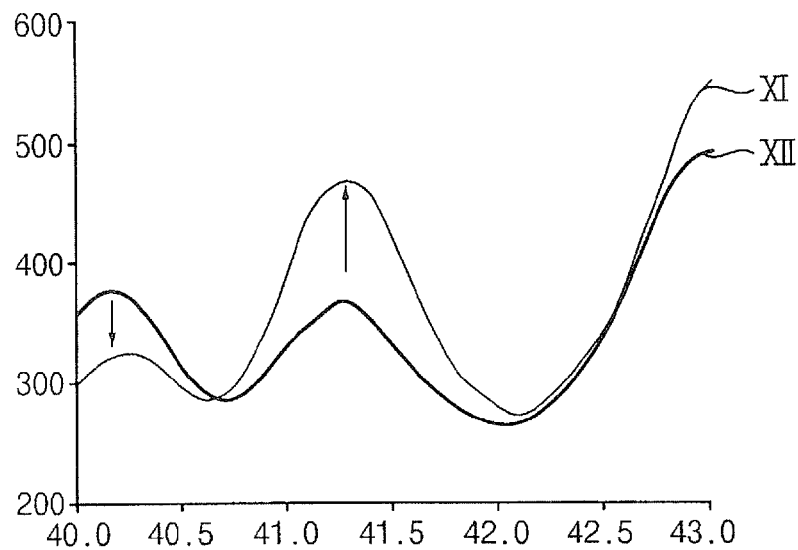

FIG. 7 is a graph illustrating contents of ingredients in contact structures according to Example and Comparative Example measured using an X-ray diffraction (XRD). In FIG. 7 "XI" means the contents of the ingredients in the contact structure including the titanium oxide silicide layer formed by the silicidation process after forming the silicon oxide layer on the contact region using the aqueous solution including ozone according to Example 3. Additionally, "XII" denotes the contents of the ingredients in the contact structure including the titanium silicide layer formed by the silicidation process after removing the native oxide film using the aqueous solution including hydrofluoric acid according to Comparative Example 5.

As illustrated in FIG. 7, when the silicon oxide layer is formed by the chemical oxidation process, a phase of titanium oxide silicide may dominate whereas a phase of titanium may be relatively small because titanium is not reacted. When removing the native oxide film from the contact regions, the content of titanium silicide may be substantially similarly to that of titanium which is not reacted. Therefore, the chemical oxidation process may accelerate the grown of titanium oxide silicide.

Figure 8:
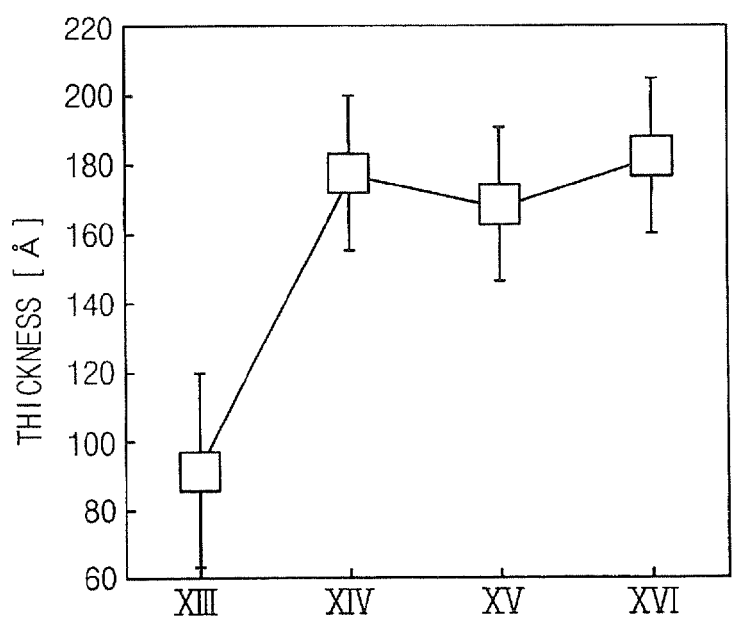

FIG. 8 is a graph illustrating thicknesses of metal oxide silicide layers in contact structures according to Examples and thicknesses of metal silicide layers in contact structures according to Comparative Examples. In FIG. 8, "XIII" means the thickness of the titanium silicide layer in the contact structure formed by the silicidation process after removing the native oxide film using the aqueous solution including hydrofluoric acid according to Comparative Example 1. Additionally, "XIV" denotes the thickness of the titanium silicide oxide in the contact structure obtained by the silicidation process after forming the silicon oxide layer using the aqueous solution including hydrofluoric acid and ozone for about 300 seconds onto the contact region according to Example 6. "XV" indicates the thickness of the titanium silicide layer in the contact structure formed by the silicidation process after forming the silicon oxide layer using the aqueous solution including hydrofluoric acid and ozone for about 90 seconds onto the contact region according to Example 1. Further, "XVI" represents the thickness of the titanium silicide oxide layer in the contact structure formed by the silicidation process after forming the silicon oxide layer using the aqueous solution including ozone for about 60 seconds onto the contact region according to Example 5.

Referring to FIG. 8, a thickness ratio between the titanium layer and the titanium silicide layer formed after removing the native oxide film is about 1.0:1.2. However, when applying the silicon oxide layer formed by the chemical oxide process, the thickness ratio may be considerably increased to about 1.0:1.8. Thus, the contact structure may include the titanium oxide silicide layer having a desired thickness when the titanium oxide silicide layer is formed through the chemical oxidation process.

FIGS. 9A to 9E are cross-sectional views illustrating a method of manufacturing a semiconductor device including a contact structure in accordance with example embodiments.

Referring to FIG. 9, an isolation layer 203 is formed to define an active region and a field region on a semiconductor substrate 200 such as a silicon substrate, a germanium substrate, a silicon-germanium substrate, etc. The isolation layer 203 may be formed by an isolation process such as a shallow trench isolation (STI) process. For example, the isolation layer 203 may be formed using silicon oxide such as USG, SOG, FOX, TOSZ, TEOS, PE-TEOS, HDP-CVD oxide, etc.

A gate insulation layer pattern 205 and a gate electrode 208 are successively formed on an active region of the semiconductor substrate 200. In example embodiments, the gate insulation layer pattern 205 and the gate electrode 208 may be formed by successively patterning a gate insulation layer and a gate conductive layer after forming the gate insulation layer and the gate conductive layer on the substrate 200 having the active region.

The gate insulation layer pattern 205 may be formed using oxide or metal oxide, and the gate electrode 208 may be formed using polysilicon, metal and/or metal compound. For example, the gate insulation layer pattern 205 may include silicon oxide, hafnium oxide (HfOx), zirconium oxide (ZrOx), tantalum oxide (TaOx), aluminum oxide (AlOx), titanium oxide (TiOx), etc. Further, the gate electrode 205 may be include polysilicon doped with impurities, tungsten, titanium, tantalum, aluminum, copper, tungsten nitride, titanium nitride, aluminum nitride, etc. These may be used alone or in a mixture thereof.

In example embodiments, a first material layer 220, a second material layer 221 and a third material layer 222 are formed on the substrate 200 and the gate electrode 208. Each of the first to the third material layers 220, 221 and 222 may include silicon and oxygen 220, 221 and 222. Further, each of the first to the third material layers 220, 221 and 222 may be formed by a residue treatment process. For example, the first to the third material layers 220, 221 and 222 may be formed while performing the reside treatment process about the substrate 200 by providing a gas containing hydrogen fluoride under an atmosphere including oxygen or by providing an SC1 solution after forming the gate electrode 208 including polysilicon.

A gate spacer 211 is formed on sidewalls of the gate electrode 208 and the gate insulation layer pattern 205 by etching a spacer formation layer after forming the spacer formation layer (not illustrated) covering the gate electrode 208 on the substrate 200. The gate spacer 211 may be formed by an anisotropic etching process. The gate spacer 211 may include nitride and/or oxynitride. For example, the gate spacer 211 may be formed using silicon nitride, silicon oxynitride, titanium oxynitride, etc.

Figure 9A:
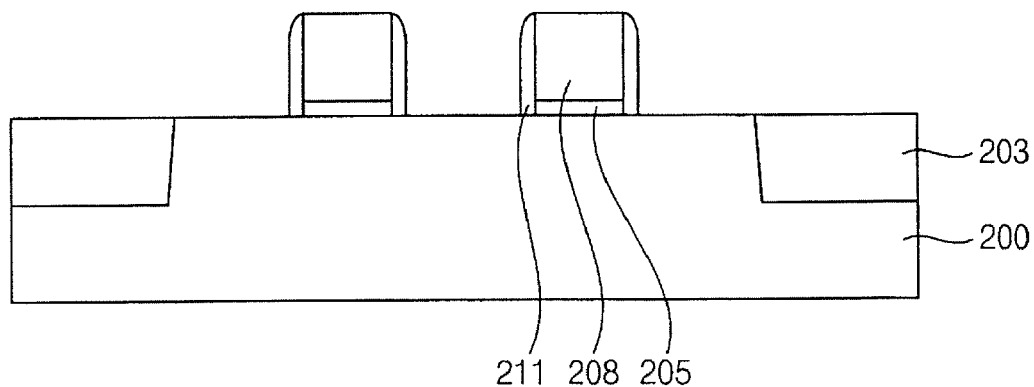
FIGS. 9A to 9E are cross-sectional views illustrating a method of manufacturing a semiconductor device including a contact structure in accordance with example embodiments.
Figure 9B:
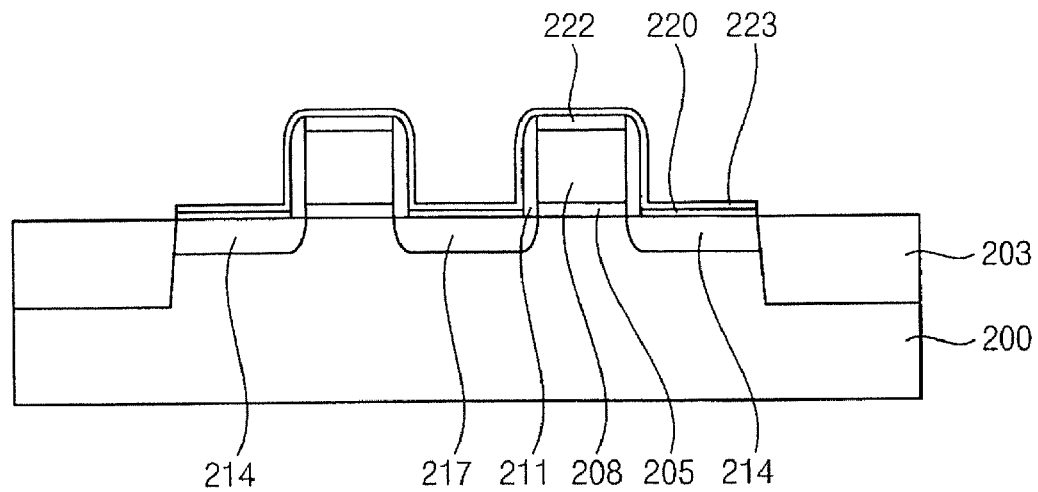

Referring to FIG. 9B, a first impurity region 214 and a second impurity region 217 are formed at portions of the substrate 200 adjacent to the gate electrode 208. The first and the second impurity regions 214 and 217 may be formed by implanting impurities into the portions of the substrate 200. For example, the first impurity region 214 and the second impurity region 217 may be formed by an ion implantation process using the gate electrode 208 as an implantation mask. The first and the second impurity regions 214 and 217 may serve as source/drain regions of a transistor.

In some example embodiments, the first and the second material layers 220 and 221 including silicon and oxygen may be formed on the first and the second impurity regions 214 and 217, respectively. When the gate electrode 208 includes silicon, the third material layer 222 including silicon and oxygen may be formed on the gate electrode 208. For example, the first to the third material layers 220, 221 and 222 including silicon and oxygen may be formed by a chemical oxidation process, a thermal oxidation process, a CVD process, a PECVD process, a HDP-CVD process, an ALD process, etc.

As described above, the first to the third material layers 220, 221 and 222 may also be formed by the residue treatment process. The processes of forming the first to the third material layers 220, 221 and 222 may be substantially the same as or substantially similar to those described with reference to FIG. 2A.

A metal layer having a uniform thickness 223 is formed on the first to the third material layer 220, 221 and 222 and the gate spacer 211. For example, the metal layer 223 may be formed using titanium (Ti), nickel (Ni), cobalt (Co), platinum (Pt), chrome (Cr), iridium (Ir), tungsten (W), tantalum (Ta), hafnium (Hf), ruthenium (Ru), zirconium (Zr), etc. These may be used alone or in a combination thereof. Further, the metal layer 223 may be formed by an ALD process, a sputtering process, a CVD process, a PLD process, an evaporation process, a plating process, etc.

Figure 9C:
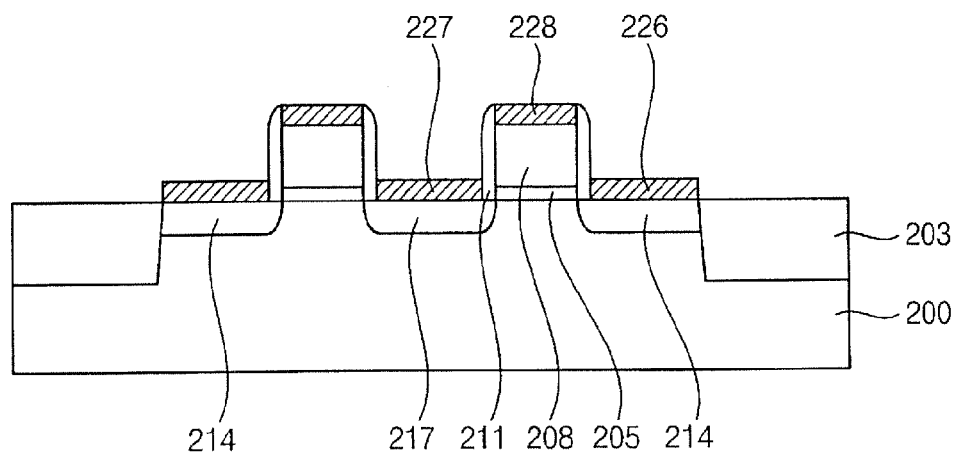
Figure 9D:
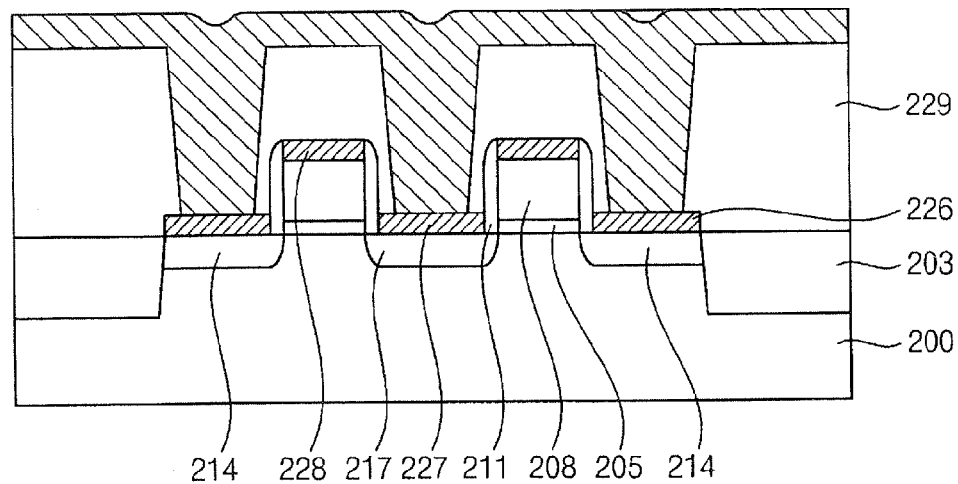

Referring to FIG. 9C, a first metal oxide silicide pattern 226, a second metal oxide silicide pattern 227 and a third metal oxide silicide pattern 228 are formed by a silicidation process between the metal layer 223 and the first to the third material layers 220, 221 and 222. The first metal oxide silicide patter 226, the second metal oxide silicide patter 227 and the third metal oxide silicide pattern 226, 227 and 228 are located on the first impurity region 214, the second impurity region 217 and the gate electrode 208. In example embodiments, unreacted portions of the metal layer 223 may be removed after the formation of the first to the third metal oxide silicide patterns 226, 227 and 228. The first to the third metal oxide silicide patterns 226, 227 and 228 may be obtained by processes substantially the same as or substantially similar to the processes described with reference to FIG. 2C.

Each of the first to the third metal oxide silicide patterns 226, 227 and 228 may have a ternary composition represented by a chemical formula of MOxSiy. Thus, the third metal oxide silicide pattern 228 may reduce a contact resistance of the gate electrode 208. In example embodiments, the third metal oxide silicide pattern 228 may be simultaneously formed with the first and the second metal oxide silicide patterns 226 and 227.

When the gate electrode 208 includes silicon, the third material layer 222 including silicon and oxygen may not be formed on the gate electrode 208. Here, when the silicidation process is carried out, the first and the second metal oxide silicide pattern 226 and 227 may be formed on the first and the second impurity regions 214 and 217, respectably. However, a metal silicide pattern (not illustrated) may not be formed on the gate electrode 208 instead of the third metal oxide silicide pattern 228. Here, the metal silicide layer pattern on the gate electrode 208 may have a composition represented by a chemical formula of MSiz without oxygen.

Referring to FIG. 9, an insulation layer 229 is formed on the substrate 200 to cover the first to the third metal oxide silicide pattern 226, 227 and 228. The insulation layer 229 may be formed using silicon oxide such as PBSG, PSG, BSG, SOG, USG, FOX, TEOS, TOSZ, PE-TEOS, HDP-CVD oxide, etc. Further, the insulation layer 229 may be formed by a CVD process, a spin coating process, a PECVD process, an HDP-CVD process, etc.

A first opening and a second opening (not illustrated) are formed by partially etching the insulation layer 229. The first and the second openings expose the first and the second metal oxide silicide patterns 226 and 227, respectively. The first and the second openings may be formed by an anisotropic etching process using a photoresist pattern or a hard mask pattern as an etching mask. Each of the first and the second openings may have a sidewall inclined with respect to the substrate 200.

A conductive layer 232 is formed on the first and the second metal oxide silicide patterns 226 and 227 and the insulation layer 229 to fill up the first and the second openings. The conductive layer 232 may be formed using polysilicon, metal and/or metal compound by an ALD process, a sputtering process, a CVD process, a PLD process, an evaporation process, a plating process, etc. For example, the conductive layer 232 may include tungsten, tungsten nitride, tungsten silicide, titanium, titanium nitride, titanium silicide, nickel, cobalt silicide, platinum, chrome, iridium, tantalum, tantalum nitride, copper, aluminum, aluminum nitride, etc. These may be used alone or in a combination thereof.

Figure 9E:
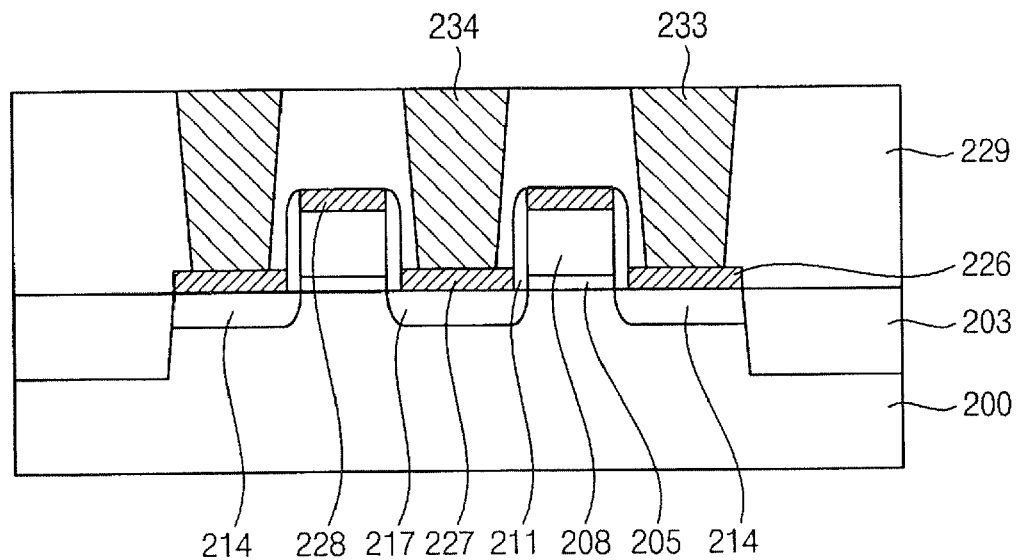

Referring to FIG. 9E, a first contact structure and a second contact structure are formed by partially removing the conductive layer 232 until the insulation layer 229 is exposed. The first and the second contact structures may be formed by a CMP process and/or an etch-back process.

The first contact structure filling the first opening may make contact with the first impurity region 214. The first contact structure includes the first metal oxide silicide pattern 226 and a first conductive pattern 233. The second contact structure filling the second opening may contact the second impurity region 217. The second contact structure includes the second metal oxide silicide pattern 227 and a second conductive layer pattern 234. The first and the second conductive layer patterns 233 and 234 are obtained by partially etching the conductive layer 232.

FIGS. 10A to 10E are cross-sectional views illustrating a method of manufacturing a semiconductor device including a contact structure in accordance with other example embodiments.

Figure 10A:
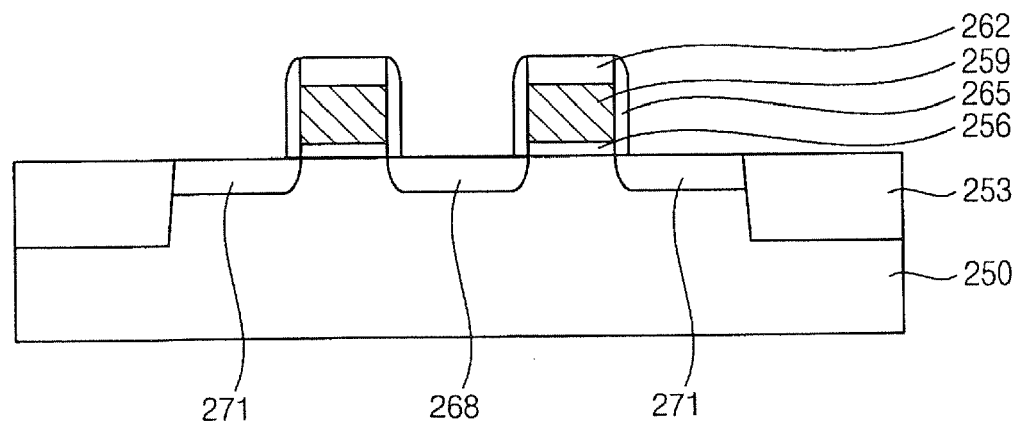
FIGS. 10A to 10E are cross-sectional views illustrating a method of manufacturing a semiconductor device including a contact structure in accordance with other example embodiments.
Figure 10B:
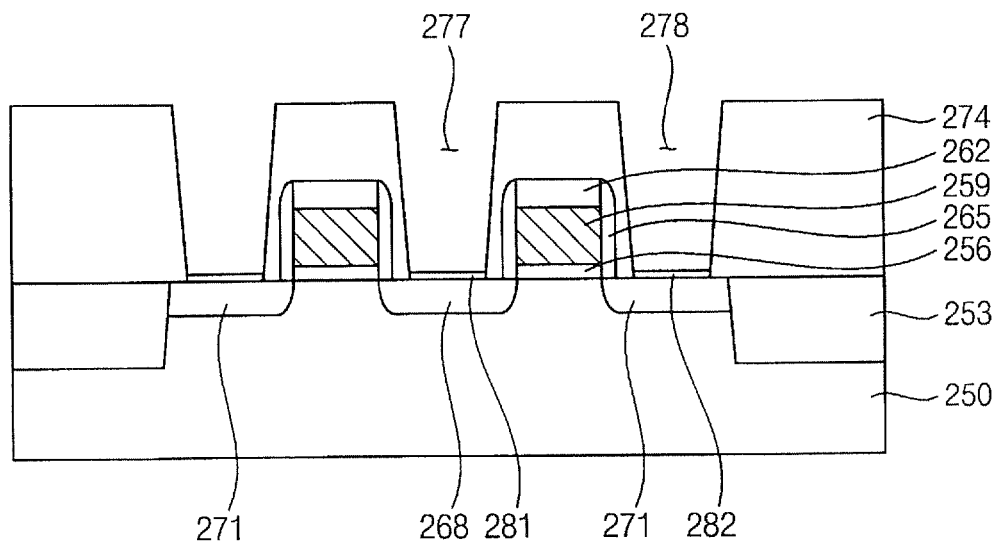

Referring to FIG. 10A, a gate structure is formed on an active region of a substrate 200 after forming an isolation layer 253 on the substrate 250. The gate structure includes a gate insulation layer pattern 256, a gate electrode 259 and a gate mask 262 successively formed on the substrate 250.

A gate spacer 265 is provided on a sidewall of the gate structure. The gate insulation layer 253, the gate insulation layer pattern 256, the gate electrode 259 and the gate spacer 265 may be formed processes substantially the same as or substantially similar to those described with reference to FIG. 9A.

The gate mask 262 may be formed using a material having an etching selectivity relative to that of the gate electrode 259. For example, the gate mask 262 may by formed using silicon nitride or silicon oxynitride.

A first impurity region 268 and a second impurity region 271 are formed by doping impurities at portions of the substrate 250 adjacent to the gate structures. The first and the second impurity regions 268 and 271 may be formed by a process substantially the same as or substantially similar to that described with reference to FIG. 9B. Each of the first and the second impurity region 268 and 271 may serve as source/drain regions of a transistor.

Referring to FIG. 9B, after forming an insulation layer 274 on the substrate 250 to cover the gate structure, a first opening 277 and a second opening 278 are formed by partially etching the insulation layer 274. The first and the second openings 277 and 278 expose the first and the second impurity regions 268 and 271, respectively. The insulation layer 274 may be formed using silicon oxide, and the first and the second openings 277 and 278 may be formed by a photolithography process.

In example embodiments, a first material layer 281 and a second material layer 282 are formed on the exposed first impurity region 268 and the exposed second impurity region 271, respectively. Each of the first and the second material layers 281 and 282 including silicon and oxygen may be formed by a process substantially the same as or substantially similar to the process described with reference to FIG. 2A or FIG. 9B.

Figure 10C:
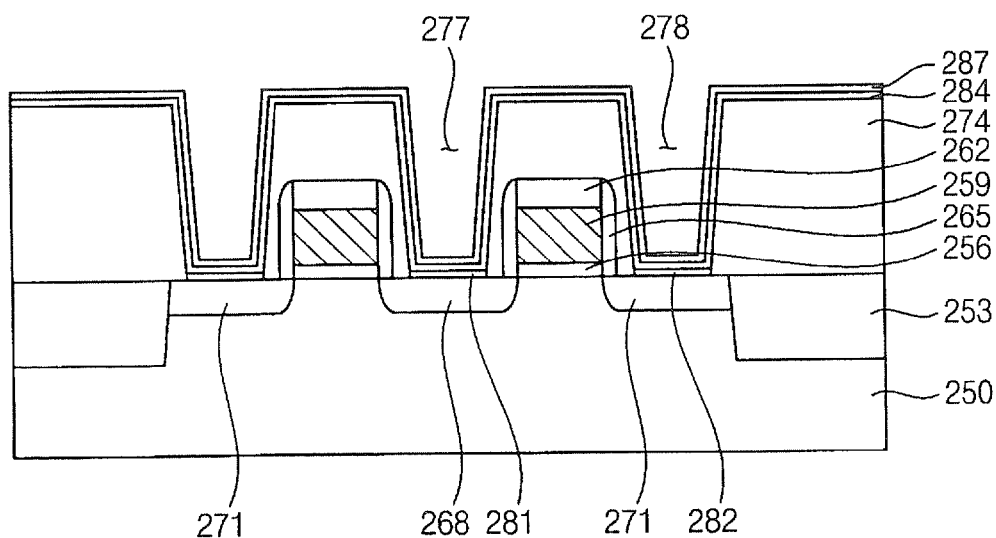

Referring to FIG. 10C, a metal layer 284 is formed on the first and the second material layers 281 and 282, sidewalls of the first and the second openings 277 and 278, and on the insulation layer 274. The metal layer 284 may include titanium, nickel, cobalt, platinum, chrome, iridium, tungsten, tantalum, hafnium, ruthenium and/or zirconium.

A diffusion barrier layer 287 is formed on the metal layer 284. The diffusion barrier layer 287 may be formed using metal compound. The diffusion barrier layer 287 may prevent diffusion of metal from the metal layer 284 or a metal oxide silicide layer 290 in successive processes.

Figure 10D:
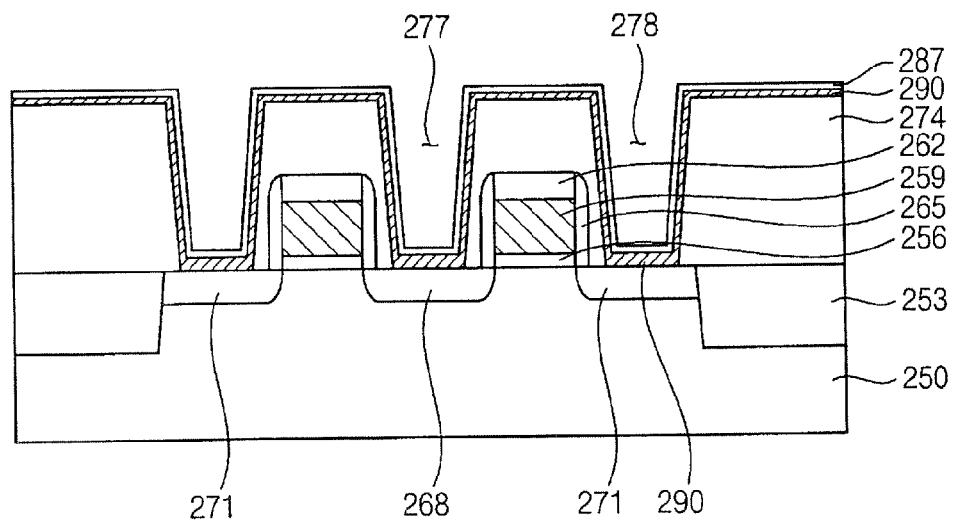

Referring to FIG. 10D, the metal oxide silicide layer 290 is formed at least on the first and the second impurity regions 268 and 271 by performing a silicidation process about the first and the second material layer 281 and 282 and the metal layer 284. The metal oxide silicide layer 290 may be obtained by a process substantially the same as or substantially similar to the process described with reference to FIG. 2C.

In example embodiments, when the insulation layer 274 contains silicon oxide, the metal oxide silicide layer 290 may be formed on the sidewalls of the first and the second openings 277 and 278 and the insulation layer 274.

Figure 10E:
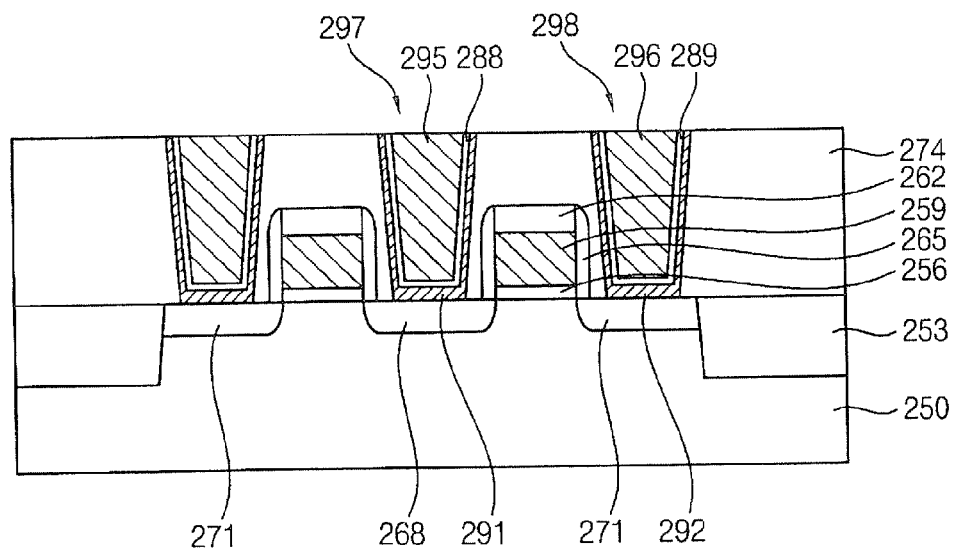

Referring to FIG. 10E, a conductive layer (not illustrated) is formed on the diffusion barrier layer 287 to fill up the first and the second openings 277 and 278. The conductive layer may be formed using polysilicon, metal and/or metal compound.

A first contact structure 297 and a second contact structure 298 are formed by partially etching the conductive layer, the diffusion barrier layer 287 and the metal oxide silicide layer 290 until the insulation layer 274 is exposed. The first and the second contact structure 297 and 298 may make contact with the first and the second impurity regions 268 and 271, respectively. The first contact structure 297 includes a first metal oxide silicide pattern 291, a first diffusion barrier pattern 288 and a first conductive layer pattern 295. The second contact structure 298 includes a second metal oxide silicide pattern 292, a second diffusion barrier pattern 289 and a second conductive layer pattern 296.

Figure 11A:
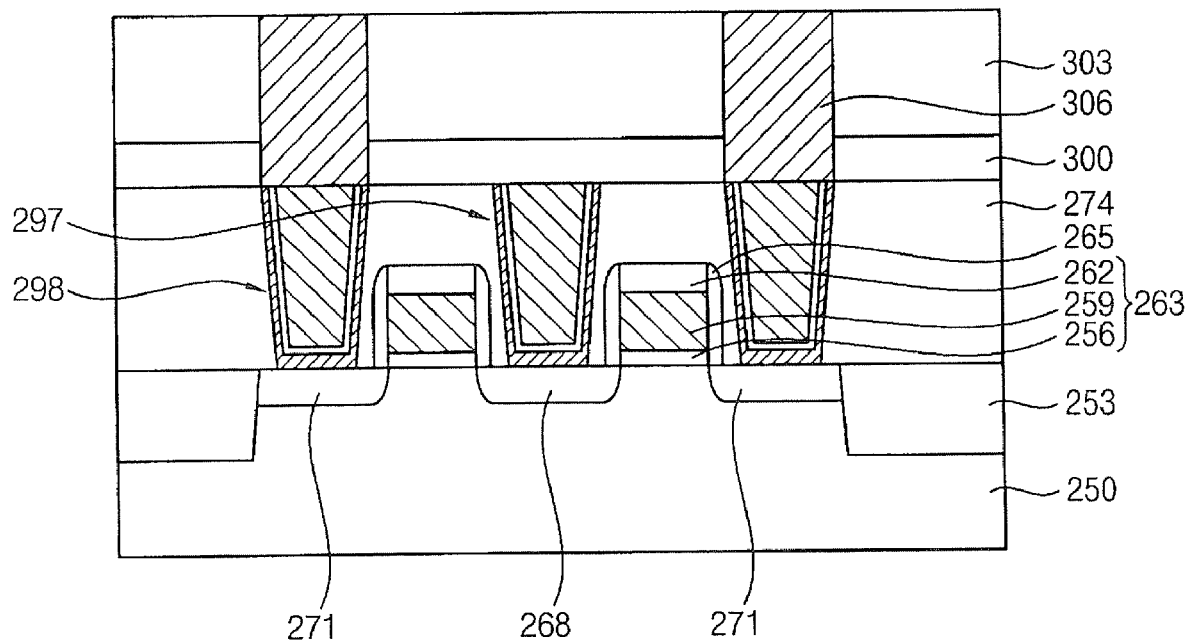
FIG. 11A and FIG. 11B are cross-sectional views illustrating a method of manufacturing a DRAM device including a contact structure in accordance with example embodiments.
Figure 11B:
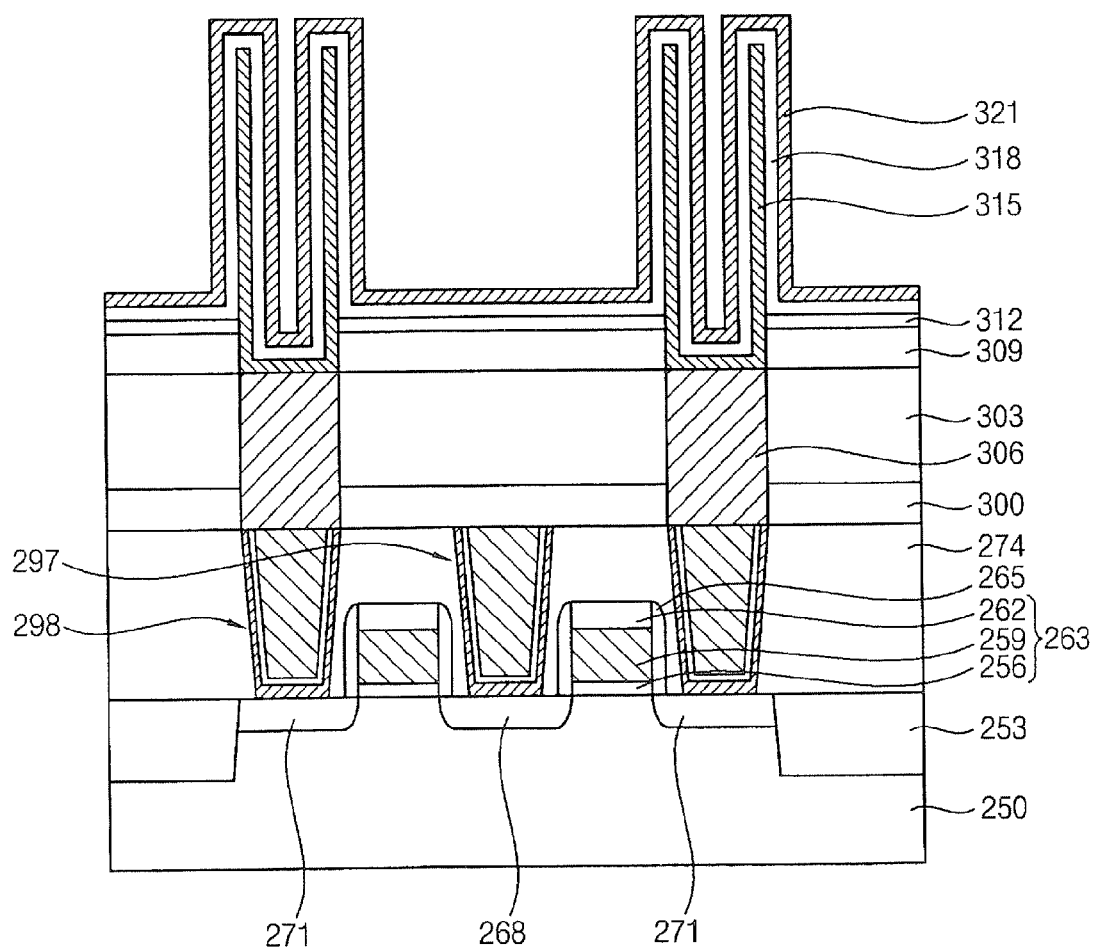

FIG. 11A and FIG. 11B are cross-sectional views illustrating a method of manufacturing a DRAM device including a contact structure in accordance with example embodiments. In the method illustrated in FIGS. 11A and 11B, a first contact structure 297 and a second contact structure 298 may be formed on a substrate 250 by processes substantially the same as or substantially similar to the processes described with reference to FIGS. 10A to 10E.

Referring to FIG. 11A, a second insulation layer 300 is formed on the first and the second contact structures 297 and 298. The second insulation layer 300 may be formed by a process substantially the same as or substantially similar to that of forming the insulation layer 274. However, the second insulation layer 300 may be formed using oxide different from the insulation layer 274.

After forming a bit line (not illustrated) on the second insulation layer 300, a third insulation layer 303 is formed on the second insulation layer 300 to cover the bit line. The bit line may have a structure substantially similar to that of the gate structure 263 serving as a word line except the gate insulation layer pattern 256. The bit line may be electrically connected to the first contact structure 297 and the first impurity region 268. For example, the bit line and the first contact structure 297 may be electrically connected through a bit line pad (not illustrated) that makes contact with the first contact structure 297 through the second insulation layer 300. The third insulation layer 303 may be formed by a process substantially the same as or substantially similar process to that of forming the first insulation layer 274.

After forming a hole (not illustrated) to expose the second contact structure 298 by partially etching the third insulation layer 303 and the second insulation layer 300, a pad 306 filling up the hole is formed on the second contact structure 298. The pad 306 may be formed by a process substantially the same as or substantially similar to the process of forming the second conductive layer pattern 296 in the second contact structure 298. The pad 306 may be electrically connected to the second impurity region 271 through the second contact structure 298.

Referring to FIG. 11B, a fourth insulation layer 309 and an etch stop layer 312 are formed on the pad 306 and the third insulation layer 303. The fourth insulation layer 309 may be formed using oxide substantially the same as or substantially similar to that of the insulation layer 274. The etch stop layer 312 may be formed using a material having an etching selectivity with respect to the fourth insulation layer 309. For example, the etch stop layer 312 may include nitride such as silicon nitride.

After forming a mold layer (not illustrated) on the etch stop layer 312, a hole for a lower electrode 315 is formed through the mold layer. Here, the etch stop layer 312 is partially etched, so that the pad 306 is exposed by the hole for the lower electrode 315.

The mold layer is removed after forming the lower electrode 315 on the pad 306 and a sidewall of the hole for the lower electrode 315. The DRAM device including a capacitor electrically connected to the second contact structure 298 is formed by successively forming a dielectric layer 318 and an upper electrode 321 on the lower electrode 315.

Figure 12A:
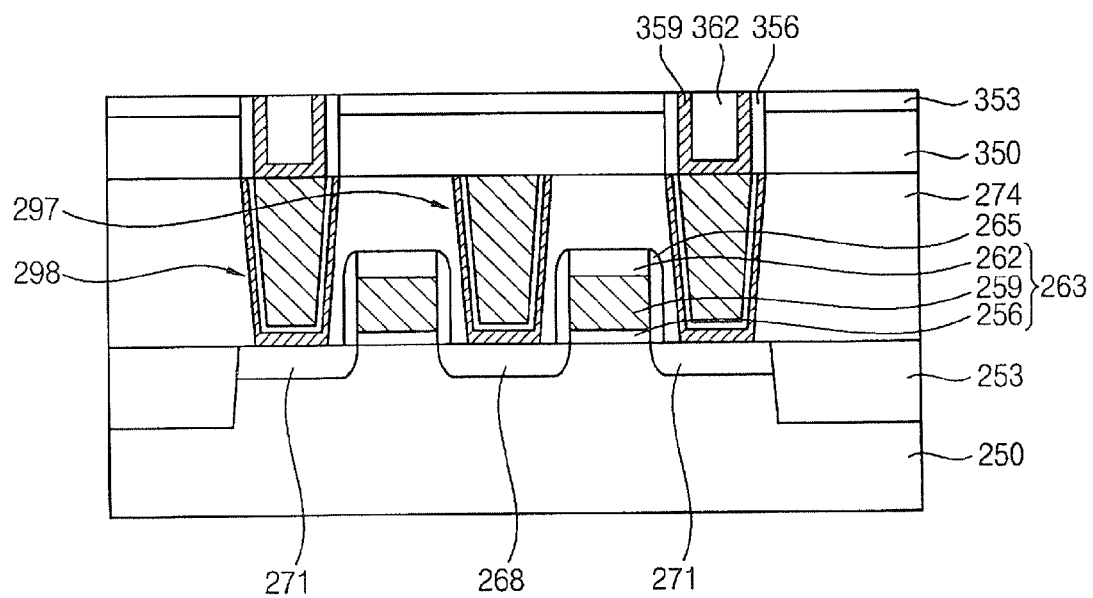
Figure 12B:
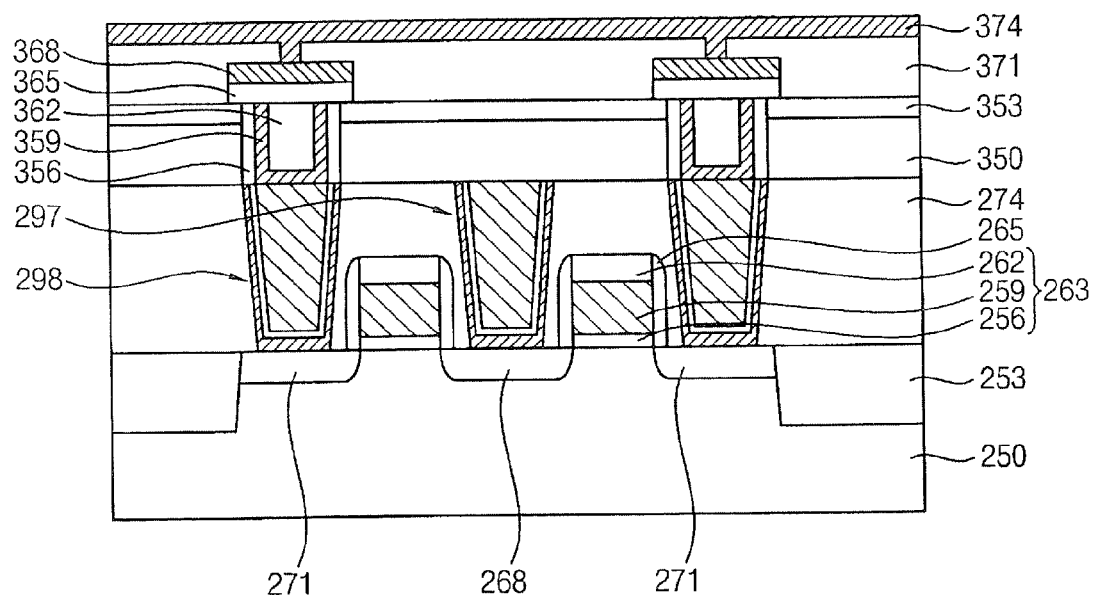

FIG. 12A and FIG. 12B are cross-sectional views illustrating a method of manufacturing a PRAM device including contact structures according to example embodiments. In the method illustrated in FIGS. 12A and 12B, processes of forming a first contact structure 297 and a second contact structure 298 on a substrate 250 may be substantially the same as or substantially similar to those described with reference to FIGS. 10A to 10E.

Referring to FIG. 12A, a first insulation layer 350 and a second insulation layer 353 are sequentially formed on the first and the second contact structures 297 and 299, and the insulation layer 274. The first and the second insulation layers 350 and 353 may serve as a mold layer for forming a lower electrode 359. The first insulation layer 350 may include a material different from that of the second insulation layer 353. For example, the first insulation layer 350 may be formed using silicon oxide and the second insulation layer 353 may be formed using silicon nitride.

After forming an opening (not illustrated) exposing the second contact structure 298 by partially etching the first and the second insulation layers 350 and 353, a spacer 356 is formed on a sidewall of the opening. The spacer 356 may be formed using nitride. A width of the lower electrode 359 may be controlled by the spacer 356 so that the lower electrode 359 may have a desired level of width by adjusting a width of the opening by the spacer 356. When the opening has a desired width, however, the spacer 356 may be omitted.

After forming the lower electrode 359 on the spacer 356 and the second contact structure 298, a filling member 362 is formed on the lower electrode 359 to fill up the opening. Accordingly, an electrode structure may include the spacer 356, the lower electrode 359 and the filling member 362. The lower electrode 359 may be formed using polysilicon, metal and/or metal compound. The lower electrode 359 may have a cylindrical shape or a ring shape. The filling member 362 may include nitride, oxide and/or oxynitride.

Referring to FIG. 12B, a phase change material layer pattern 365 and an upper electrode 368 are formed on the electrode structure. The phase change material layer pattern 365 may be formed using a chalcogen compound including GST, and the upper electrode 368 may be formed using metal and/or metal compound.

After forming an upper insulation layer 371 on the second insulation layer 353 to cover the phase change material layer pattern 365 and the upper electrode 368, an upper opening (not illustrated) exposing the upper electrode 368 is formed by partially etching the upper insulation layer 371. A PRAM device is provided on the substrate 250 by forming an upper wiring 374 filling up the upper opening on the upper insulation layer 371. The upper wiring 374 may be formed using metal and/or metal compound.

According to example embodiments, a contact structure may include a metal oxide silicide layer (pattern) having a uniform thickness and improved thermal stability to properly adjust an interface resistance and a contact resistance of the contact structure. When the contact structure is employed in a semiconductor device, the semiconductor device may ensure enhanced thermal and electrical characteristics.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming a contact structure, the method comprising:
    forming an insulation layer on an object having a contact region after removing a native oxide layer from the contact region;
    forming an opening exposing the contact region by partially etching the insulation layer;
    forming a material layer including silicon and oxygen on the exposed contact region;
    forming a metal layer on the material layer;
    uniformly forming a metal oxide silicide layer at least on the contact region by reacting the material layer with the metal layer to provide amounts of metal and oxygen in the metal oxide silicide layer that are about equal to one another; and
    forming a conductive layer on the metal oxide silicide layer to fill up the opening, wherein the metal oxide silicide layer reduces an interface resistance between the contact region and the conductive layer.

2. The method of claim 1, wherein the material layer is formed by a chemical oxidation process, a thermal oxidation process, a chemical vapor deposition (CVD) process, a high density plasma-chemical vapor deposition (HDP-CVD) process, a residue treatment process or an atomic layer deposition (ALD) process.

3. The method of claim 2, wherein the material layer is formed using one selected from the group consisting of a solution including ozone, a solution including ozone and hydrogen fluoride (HF), and a solution including hydrogen peroxide ($H_2O_2$).

4. The method of claim 3, wherein the material layer is formed by providing a solution having an ozone concentration of about 10 ppm to about 50 ppm onto the object for about 5 seconds to about 200 seconds.

5. The method of claim 3, wherein the material layer is formed by providing an aqueous solution including diluted hydrofluoric acid, in which a volume ratio between $H_2O$ and HF is about 50:1 to about 1,000:1, and a solution having an ozone concentration of about 10 ppm to about 50 ppm onto the object for about 5 seconds to about 600 seconds.

6. The method of claim 3, wherein the material layer is formed by providing the solution including hydrogen peroxide onto the object for about 10 seconds to about 600 seconds.

7. The method of claim 3, wherein the material layer is formed by thermally treating the object for about 10 seconds to about 60 seconds under an atmosphere including about 50 to about 90 percent by weight of oxygen.

8. The method of claim 2, wherein the material layer is formed by providing a gas including fluorine (F) onto the object under an atmosphere including oxygen ($O_2$).

9. The method of claim 1, wherein the material layer comprises one selected from the group consisting of silicon oxide, silicon oxynitride and silicon-germanium oxide.

10. The method of claim 1, wherein the metal layer comprises at least one selected from the group consisting of titanium (Ti), nickel (Ni), cobalt (Co), platinum (Pt), chrome (Cr), iridium (Ir), tungsten (W), tantalum (Ta), hafnium (Hf), ruthenium (Ru) and zirconium (Zr).

11. The method of claim 1, wherein the metal oxide silicide layer is formed on a sidewall of the opening.

12. The method of claim 1, wherein the metal oxide silicide layer has a ternary composition that comprises oxygen, silicon and metal represented by the following chemical formula:

$MO_xSi_y$ wherein M indicates metal.

13. The method of claim 12, wherein the metal comprises at least one selected from the group consisting of titanium (Ti), nickel (Ni), cobalt (Co), platinum (Pt), chrome (Cr), iridium (Ir), tungsten (W), tantalum (Ta), hafnium (Hf), ruthenium (Ru) and zirconium (Zr).

14. The method of claim 1, further comprising forming a diffusion barrier layer on the metal layer prior to forming the metal oxide silicide layer.

15. The method of claim 1 wherein the metal oxide silicide layer comprises a thickness in a range between about 170 Angstroms and about 190 Angstroms.

* * * * *